(12) United States Patent
Goodell et al.

(10) Patent No.: US 12,214,447 B2
(45) Date of Patent: Feb. 4, 2025

(54) SYNCHRONOUS MOTION SELECTIVE SOLDERING APPARATUS AND METHOD

(71) Applicant: NORDSON CORPORATION, Westlake, OH (US)

(72) Inventors: Gregory E. Goodell, Spokane, WA (US); Carlos E. Bouras, Spokane, WA (US); Michael A. Cable, Liberty Lake, WA (US)

(73) Assignee: Nordson Corporation, Westlake, OH (US)

( * ) Notice: Subject to any disclaimer, the term of this patent is extended or adjusted under 35 U.S.C. 154(b) by 727 days.

(21) Appl. No.: 16/767,154

(22) PCT Filed: Nov. 27, 2018

(86) PCT No.: PCT/US2018/062536
§ 371 (c)(1),
(2) Date: May 27, 2020

(87) PCT Pub. No.: WO2019/108508
PCT Pub. Date: Jun. 6, 2019

(65) Prior Publication Data
US 2020/0384562 A1    Dec. 10, 2020

Related U.S. Application Data

(60) Provisional application No. 62/591,711, filed on Nov. 28, 2017.

(51) Int. Cl.
*B23K 3/08*    (2006.01)
*B23K 1/00*    (2006.01)
(Continued)

(52) U.S. Cl.
CPC ............. *B23K 3/08* (2013.01); *B23K 1/0016* (2013.01); *B23K 3/0653* (2013.01); *B08B 3/08* (2013.01);
(Continued)

(58) Field of Classification Search
None
See application file for complete search history.

(56) References Cited

U.S. PATENT DOCUMENTS 4,540,114 A * 9/1985 Pachschwoll ........ B23K 3/0653
228/180.1
4,616,775 A * 10/1986 Simonetti ............ B23K 3/0676
228/56.1
(Continued)

FOREIGN PATENT DOCUMENTS

CN    203265821 U    11/2013
CN    205967713 U    2/2017
(Continued)

*Primary Examiner* — Devang R Patel
(74) *Attorney, Agent, or Firm* — BakerHostetler

(57) ABSTRACT

Methods and apparatus for applying molten solder are disclosed. A system for applying solder to a workpiece includes a conveyor for moving a first workpiece along a machine direction, and a first selective soldering nozzle to apply solder to the first workpiece while the first workpiece is moving along the machine direction. The system can also include a flux application area to apply flux to bottoms of workpieces, a heating area to heat the bottoms of the workpieces, and a conveyor to convey the workpieces. The workpiece can constantly move through multiple areas, such as a flux application area, a heating area, and a selective soldering area. As such, two or more areas can operate on the workpiece simultaneously and while the workpiece is moving. The method includes applying solder from the first (Continued)

selective soldering nozzle to the first workpiece while the first workpiece is moving along the machine direction.

21 Claims, 7 Drawing Sheets

(51) Int. Cl.
 B23K 3/06 (2006.01)
 H05K 13/04 (2006.01)
 B08B 3/08 (2006.01)
 B23K 101/42 (2006.01)
(52) U.S. Cl.
 CPC ...... *B23K 2101/42* (2018.08); *H05K 13/0465* (2013.01)

(56) References Cited

U.S. PATENT DOCUMENTS

| | | | |
|---|---|---|---|
| 4,890,781 A | | 1/1990 | Johnson et al. |
| 4,921,156 A | * | 5/1990 | Hohnerlein ............ B23K 1/085 |
| | | | 228/43 |
| 5,515,605 A | | 5/1996 | Hartmann et al. |
| 5,534,067 A | | 7/1996 | Fulker et al. |
| 6,367,677 B1 | * | 4/2002 | Hildenbrand ........ B23K 3/0653 |
| | | | 228/43 |
| 6,799,709 B2 | | 10/2004 | Takaguchi et al. |
| 7,797,069 B2 | | 9/2010 | Silverbrook |
| 8,039,289 B2 | | 10/2011 | Parks et al. |
| 8,247,681 B2 | | 8/2012 | Reinisch |
| 8,247,741 B2 | * | 8/2012 | Pepler ................. H01L 31/1828 |
| | | | 219/393 |
| 8,673,777 B2 | | 3/2014 | Black et al. |
| 8,715,759 B2 | | 5/2014 | Larson |
| 9,486,880 B2 | * | 11/2016 | Tombs ..................... B23K 1/08 |
| 10,010,958 B2 | * | 7/2018 | Kurtz ................. H05K 13/0465 |
| 2002/0036223 A1 | * | 3/2002 | Saito .................... B23K 3/0653 |
| | | | 228/8 |
| 2002/0096556 A1 | | 7/2002 | Hildenbrand et al. |
| 2003/0111517 A1 | * | 6/2003 | Takaguchi ........... H05K 3/3468 |
| | | | 228/180.1 |
| 2005/0167519 A1 | * | 8/2005 | Holm .................. B05B 17/0607 |
| | | | 239/4 |
| 2007/0039999 A1 | | 2/2007 | Sung |
| 2008/0310938 A1 | | 12/2008 | Inoue et al. |
| 2009/0084412 A1 | * | 4/2009 | Ramanan ................ B08B 3/022 |
| | | | 134/103.3 |
| 2010/0059575 A1 | * | 3/2010 | Isler ..................... H05K 3/3468 |
| | | | 228/37 |
| 2015/0298233 A1 | * | 10/2015 | Dreikorn .............. B23K 3/0646 |
| | | | 228/33 |

FOREIGN PATENT DOCUMENTS

| | | |
|---|---|---|
| CN | 106536109 A | 3/2017 |
| CN | 106852015 A | 6/2017 |
| DE | 19541340 A1 | 5/1997 |
| DE | 102014110720 A1 | 2/2016 |
| EP | 3153270 A1 | 4/2017 |
| WO | 2014/086954 A1 | 6/2014 |
| WO | 2016/018759 A1 | 2/2016 |

* cited by examiner

SYNCHRONOUS MOTION SELECTIVE SOLDERING APPARATUS AND METHOD

CROSS REFERENCE TO RELATED APPLICATIONS

This application is a U.S. National Stage Application of International Patent App. No. PCT/US2018/062536, filed Nov. 27, 2018, which claims the benefit of U.S. Provisional Patent App. No. 62/591,711, filed Nov. 28, 2017, the entire disclosures of both of which are hereby incorporated by reference as if set forth in their entireties herein.

TECHNICAL FIELD

The present invention generally relates to a selective soldering machine and method for applying molten solder to a workpiece, and more particularly relates to a soldering machine and method for soldering while the workpiece is continuously moving.

BACKGROUND

Selective soldering machines are advantageous in that they can apply molten solder to individual pins of a component on a substrate, or groups of pins, without disturbing other components that need not be soldered or cannot withstand, for example, the heat producing effects of wave soldering machines. With selective soldering, a small fountain (e.g., column) of solder is formed using a nozzle that is oriented vertically, and the nozzle and the fountain of solder are selectively raised to engage the printed circuit board ("PCB") hole through which the pin of a component extends, or grouping of pins/holes extend. In contrast, in a wave soldering machine the PCB is moved by a conveyor over the top of a stationary wave solder nozzle, which spans an entire width of the PCB. Components disposed on a bottom side of the PCB that are heat sensitive must be shielded by a protective fixture, and PCBs that have components disposed on the bottom side that exceed a predetermined height (e.g., over a quarter of an inch high) cannot be soldered on a wave soldering machine because these components would collide with the wave solder nozzle during operation.

Traditional multiple station selective soldering machines apply flux and molten solder to workpieces in designated stations. In such traditional multiple station selective soldering machines, work may be performed via one or more fluxing nozzles in a fluxing station and via one or more solder nozzles in a selective soldering station. For these traditional multiple station selective soldering machines, it is necessary to stop conveyance of the workpieces in each respective station because the work must be performed while the workpiece is stationary. Stopping of the conveyance of the workpieces has the detrimental effect of reducing the throughput capacity (i.e., the number of workpieces that can be processed by the machine in a given time) of traditional selective soldering machines, since time is wasted each time the workpiece stops at one of the stations. In addition, depending on the complexity of the workpiece, the time for soldering different workpieces can be different.

Further, traditional multiple station selective soldering machines require a number of components, for example, stop pins, sensors, conveyor breaks, multiple conveyor motors, etc., to stop the workpieces at each station and thereby permit the work to be performed. These additional components, which are necessary to stop the workpiece at each station, increase the complexity, cost, and overall footprint of the machine, since the stations must be spaced apart from each other to accommodate the additional components. Further, because each workpiece stops at each station, the length of a given workpiece that can be processed in traditional multiple station selective soldering machines is limited to the length of the shortest station of the machine.

Accordingly, there exists a need for improved soldering machines and methods that address the above deficiencies.

SUMMARY

Aspects of the present disclose are directed to a method for applying solder to a workpiece, the method including receiving a first workpiece moving along a machine direction, and moving a first selective soldering nozzle along the machine direction and a direction orthogonal to the machine direction. The method also includes applying solder from the first selective soldering nozzle to the first workpiece while the first workpiece is moving along the machine direction.

Receiving the first workpiece moving along the machine direction includes moving the first workpiece along the machine direction using a conveyor.

The method further including: preventing relative movement between the first workpiece and the conveyor, associating a detected position of the first workpiece relative to the conveyor with tracked positional data of the conveyor as the conveyor moves the first workpiece along the machine direction and monitoring, indirectly and continuously, a position of the first workpiece as the conveyor moves the first workpiece along the machine direction based upon the tracked positional data of the conveyor associated with the detected position of the first workpiece.

Moving of the first selective soldering nozzle along the machine direction tracks the moving of the first workpiece along the machine direction.

The method further including sensing movement of a leading edge of the first workpiece. Moving of the first selective soldering nozzle along the machine direction tracks the moving of the first workpiece along the machine direction based upon the sensed movement of the leading edge of the first workpiece. Applying of the solder occurs while the first selective soldering nozzle tracks the movement of the first workpiece along the machine direction.

The method further including synchronizing the movement of the first selective soldering nozzle with the movement of the first workpiece, prior to the applying of the solder from the first selective soldering nozzle, based upon the sensed movement of the leading edge of the first workpiece.

The method further including: moving a second selective soldering nozzle along the machine direction and the direction orthogonal to the machine direction, and applying solder from the second selective soldering nozzle to the first workpiece while the first workpiece is moving along the machine direction and while the first selective soldering nozzle is applying solder to the first workpiece.

The method further including: moving a third selective soldering nozzle along the machine direction and the direction orthogonal to the machine direction, and applying solder from the third selective soldering nozzle to the first workpiece while the first workpiece is moving along the machine direction and while the first and second selective soldering nozzles are applying solder to the first workpiece.

The moving of the first, second, and third selective soldering nozzles along the machine direction tracks the moving of the first workpiece along the machine direction.

The method further including sensing a movement of a leading edge of the first workpiece. The moving of the first, second, and third selective soldering nozzles along the machine direction tracks the moving of the first workpiece along the machine direction based upon the sensed movement of the leading edge of the first workpiece. The applying of the solder occurs while the respective first, second, and third selective soldering nozzles track the movement of the first workpiece along the machine direction.

The method further including synchronizing the movement of the first, second, and third selective soldering nozzles with the movement of the first workpiece, prior to the applying of the solder from the respective first, second, and third selective soldering nozzles, based upon the sensed movement of the leading edge of the first workpiece.

The method further including heating the first workpiece while the first workpiece is moving along the machine direction and while the first selective soldering nozzle is applying solder to the first workpiece.

The method furthering including: receiving a second workpiece moving along the machine direction subsequent to reception of the first workpiece, applying solder from the first selective soldering nozzle to the second workpiece while the second workpiece is moving along the machine direction, and while the second selective soldering nozzle is applying solder to the first workpiece.

The method further including: moving a fluxing nozzle along the machine direction and the direction orthogonal to the machine direction, and applying flux from the fluxing nozzle to the first workpiece while the first workpiece is moving along the machine direction.

The method further including heating the first workpiece while the first workpiece is moving along the machine direction.

The first workpiece is heated while the first workpiece is moving along the machine direction and while the fluxing nozzle is applying flux to the first workpiece.

The moving of the fluxing nozzle along the machine direction tracks the moving of the first workpiece along the machine direction.

The method further including sensing a movement of a leading edge of the first workpiece. The moving of the fluxing nozzle along the machine direction tracks the moving of the first workpiece along the machine direction based upon the sensed movement of the leading edge of the first workpiece. The applying of the flux occurs while the fluxing nozzle tracks the movement of the first workpiece along the machine direction.

The method further including synchronizing the movement of the fluxing nozzle with the movement of the first workpiece, prior to the applying of the flux from the fluxing nozzle, based upon the sensed movement of the leading edge of the first workpiece.

Other aspects of the present disclosure are directed to a system for applying solder to a workpiece, the system including a conveyor for moving a first workpiece along a machine direction. The system also includes a first selective soldering nozzle configured to move along the machine direction and a direction orthogonal to the machine direction, and to apply solder to the first workpiece while the first workpiece is moving along the machine direction on the conveyor.

The system further including a second selective soldering nozzle configured to move along the machine direction and the direction orthogonal to the machine direction, and to apply solder to the first workpiece while the first workpiece is moving along the machine direction on the conveyor and while the first selective soldering nozzle applies solder to the first workpiece.

The system further including a third selective soldering nozzle configured to move along the machine direction and the direction orthogonal to the machine direction, and to apply solder to the first workpiece while the first workpiece is moving along the machine direction on the conveyor and while the first and second selective soldering nozzles apply solder to the first workpiece.

The system further including: a plurality of sensors that are each associated with one of the first, second, and third selective soldering nozzles and that are configured to sense movement of the first workpiece, and a controller that is configured to selectively control movement of each of the first, second, and third selective soldering nozzles to predetermined positions of the first workpiece and along the machine direction based upon the movement of the first workpiece sensed by the respective sensors.

The system further including a heater configured to heat the first workpiece while the first workpiece moves along the machine direction and while the first selective soldering nozzle applies solder to the first workpiece.

The conveyor moves a second workpiece in the machine direction subsequent to reception of the first workpiece. The first selective soldering nozzle is configured to apply solder to the second workpiece while the second workpiece moves along the machine direction and while the second selective soldering nozzle applies solder to the first workpiece.

The system further including a fluxing nozzle configured to move along the machine direction and the direction orthogonal to the machine direction. The fluxing nozzle is configured to apply flux to the first workpiece while the first workpiece moves along the machine direction on the conveyor.

The system further including: a sensor associated with the fluxing nozzle that is configured to sense movement of the first workpiece, and a controller that is configured to selectively control movement of the fluxing nozzle to predetermined positions of the first workpiece and to control movement of the fluxing nozzle along the machine direction based upon the movement of the first workpiece sensed by the sensor.

The system further including a heater configured to heat the first workpiece while the first workpiece moves along the machine direction and while the fluxing nozzle applies flux to the first workpiece.

The system further including a pump configured to move solder from a solder pot to the first selective soldering nozzle.

The system further including a controller configured to control operation of the conveyor and the first selective soldering nozzle.

The first selective soldering nozzle is configured to apply solder to a subset of a plurality of exposed component pins on the first workpiece.

The first workpiece is a circuit board.

The system further including a holder fixedly attached to the conveyor such that the conveyor is configured to convey the holder along the machine direction. The holder is configured to grasp the first workpiece so as to prevent relative movement between the conveyor and the first workpiece while the conveyor moves the first workpiece.

The system further including a controller that is configured to continuously monitor a position of the first workpiece while the first workpiece is moved by the conveyor along the machine direction.

The controller is configured to: associate a detected position of the first workpiece relative to the conveyor with tracked positional data of the conveyor as the conveyor moves the workpiece along the machine direction, and indirectly and continuously monitor a position of the first workpiece as the first workpiece is moved by the conveyor along the machine direction based upon the tracked positional data of the conveyor associated with the detected position of the first workpiece.

A further aspect of the present disclosure is directed to a selective soldering machine for selectively soldering workpieces, including a flux application area configured to apply flux to bottoms of the workpieces, a heating area configured to heat the bottoms of the workpieces, and a selective soldering area configured to selectively solder the bottoms of the workpieces. The selective soldering machine also includes a conveyor configured to convey the workpieces, the conveyor extends through the flux application area, the heating area, and the selective soldering area. The selective soldering machine also includes a controller that is configured to control the conveyor to continuously convey the workpieces through the flux application area, the heating area, and the selective soldering area and to control the application of flux, heat, and solder at each respective area without stopping the workpieces. The flux application area abuts against the heating area and the heating area abuts against the selective soldering area.

The conveyor is configured to convey the workpieces in a machine direction.

The selective soldering area includes a first selective soldering nozzle and a first solder pot in fluid communication with the first selective soldering nozzle.

The selective soldering area includes a second selective soldering nozzle and a second solder pot in fluid communication with the second selective soldering nozzle. The first selective soldering nozzle is configured to move along a machine direction and a direction orthogonal to the machine direction, and to apply solder to a first workpiece of the workpieces while the first workpiece moves along the machine direction on the conveyor. The second selective soldering nozzle is configured to move along the machine direction and the direction orthogonal to the machine direction, and to apply solder to the first workpiece while the first workpiece moves along the machine direction on the conveyor and while the first selective soldering nozzle applies solder to the first workpiece.

The first solder pot and the second solder pot are arranged staggered relative each other along at least one of the machine direction and the direction orthogonal to the machine direction.

The controller is further configured to selectively control movement of the first solder pot and the second solder pot to predetermined positions of the first workpiece.

The flux application area includes a fluxing nozzle and the heating area includes a heater.

The workpieces are circuit boards.

The conveyor is a single conveyor for conveying the workpieces.

The single conveyor is a chain conveyor driven by a single motor.

No stop pins are provided to stop the workpieces between a beginning and an end of the conveyor.

Another aspect of the present disclosure includes a method for applying solder to a workpiece using a selective soldering machine including a flux application area, a heating area, and a selective soldering area. The method includes conveying a first workpiece through the flux application area, the heating area, and the selective soldering area, in that order. The method also includes applying flux to a bottom of the first workpiece while the first workpiece is conveying through the flux application area, heating a front end of the first workpiece while the first workpiece is conveying through the heating area and while applying the flux to a rear end of the first workpiece in the flux application area, and selectively soldering the front end of the first workpiece using a selective soldering nozzle of the selective soldering area while heating the rear end of the first workpiece in the heating area.

Conveying the first workpiece includes moving the first workpiece along a machine direction using a conveyor.

The method further including: selectively soldering a first portion of the front end of the first workpiece using a first selective soldering nozzle of the selective soldering area while heating the rear end of the first workpiece in the heating area, and selectively soldering a second portion of the front end of the first workpiece using a second selective soldering nozzle of the selective soldering area that is staggered from the first selective soldering nozzle while selectively soldering a first portion of the rear end of the first workpiece using the first selective soldering nozzle.

The method further including moving a fluxing nozzle of the flux application area that applies the flux, along a machine direction where the first workpiece is conveyed and a direction orthogonal to the machine direction while applying the flux and while the first workpiece is conveying through the flux application area.

The method also including moving a selective soldering nozzle of the selective soldering area along the machine direction and the direction orthogonal to the machine direction while the first workpiece is conveying through the selective soldering area.

The method further including the step of constantly moving the first workpiece through the flux application area, the heating area, and the selective soldering area.

Various additional features and advantages of this invention will become apparent to those of ordinary skill in the art upon review of the following detailed description of the illustrative embodiments taken in conjunction with the accompanying drawings.

BRIEF DESCRIPTION OF THE DRAWINGS

The following detailed description is better understood when read in conjunction with the appended drawings. For the purposes of illustration, examples are shown in the drawings; however, the subject matter is not limited to the specific elements and instrumentalities disclosed. In the drawings.

DETAILED DESCRIPTION OF ILLUSTRATIVE EMBODIMENTS

Figure 1:
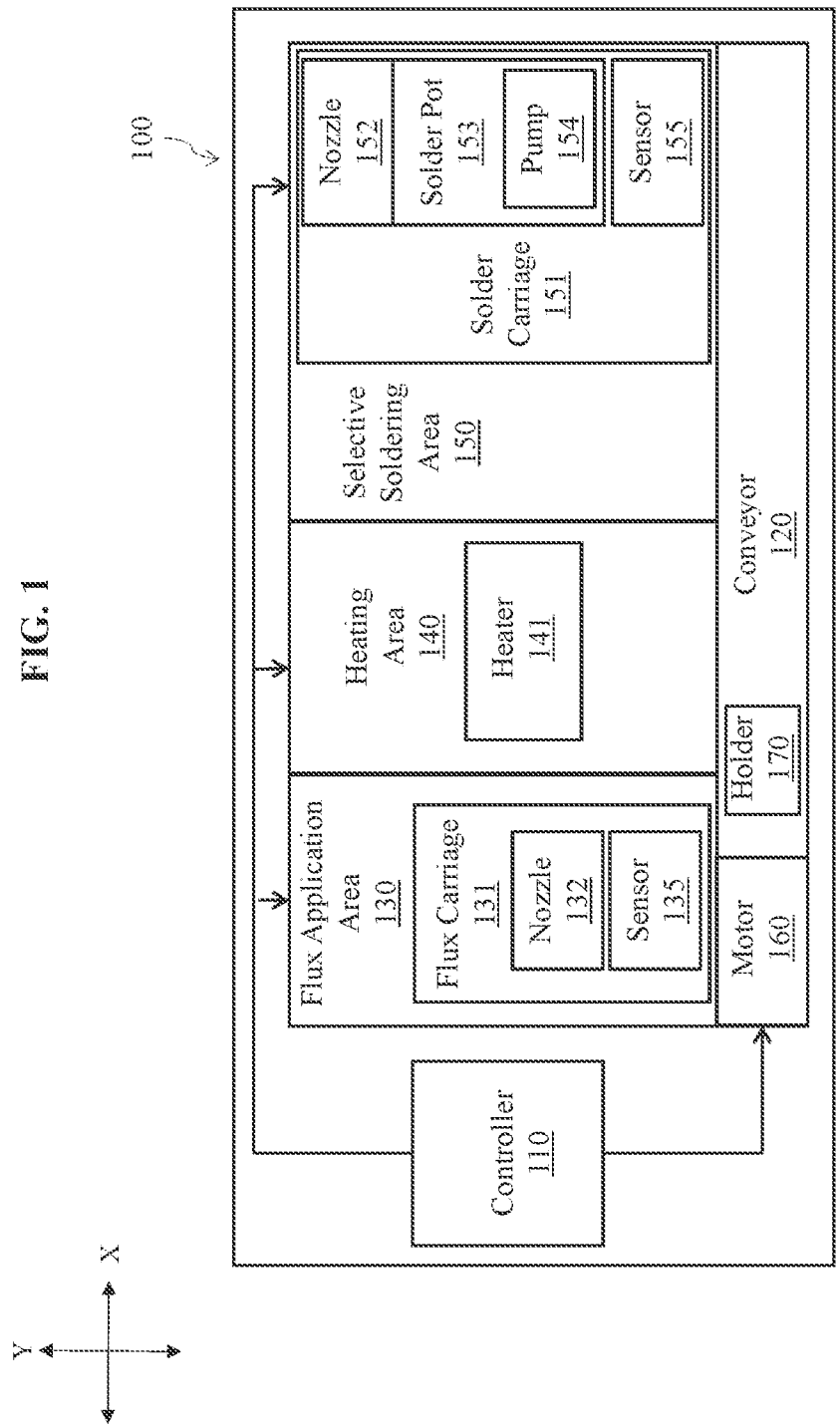
FIG. 1 illustrates a schematic view of an exemplary soldering machine in accordance with aspects of the present disclosure.

Referring to FIG. 1, a selective soldering machine 100 in accordance with aspects of the present disclosure is illustrated. The selective soldering machine 100 may include, a conveyor 120, a flux application area 130, a heating area 140, and/or a selective soldering area 150. The conveyor 120 may be configured to move one or more workpiece (not shown) along a machine direction, e.g., along a horizontal X axis as depicted in FIG. 1, through the flux application area 130, the heating area 140, and/or the selective soldering area 150. The workpiece may be a printed circuit board ("PCB") that may include a plurality of exposed component pins. The workpiece may be continuously conveyed by the conveyor 120 along the machine direction through the flux application area 130, the heating area 140, and the selective soldering area 150, in that order. The selective soldering machine 100 may further include a controller 110 (e.g., a computer) that may control the conveyor 120 to continuously convey the workpieces through the flux application area 130, the heating area 140, and the selective soldering area 150 to control the application of flux, heat, and solder at each respective area without stopping the workpieces.

The conveyor 120 may be a single conveyor that extends continuously through the flux application area 130, the heating area 140, and the selective soldering area 150. The conveyor 120 may comprise systems that utilizes belts, chains, rails, and/or rollers and the same drive system, including for example a motor 160, may be used to convey the workpiece through each of the areas. The conveyor 120 may be a chain conveyor driven by a single motor 160. The controller 110 may control the conveyor 120 to continuously convey the workpieces through the flux application area 130, the heating area 140, and the selective soldering area 150 and may control the application of flux, heat, and solder at each respective area without stopping the workpieces. The conveyor 120 may be provided without stop pins. That is, stop pins may not be provided to stop the workpieces between a beginning and an end of the conveyor such that the conveyor moves continuously under control of the controller 110.

The selective soldering machine 100 may also include a holder 170 that may be fixedly attached to the conveyor 120 such that the conveyor 120 may convey the holder 170 along the machine direction. The holder 170 may be configured to grasp the workpiece and/or a pallet that holds multiple workpieces. For example, the holder 170 may include one or more clamps (not shown) that clamp the workpiece to the conveyor 120. The holder 170 may directly or indirectly gasp the workpiece such that the there is no relative movement (i.e., no slippage) between the workpiece and, e.g., the chain, belt, etc. of the conveyor 120 while the conveyor 120 continuously conveys the workpiece through, e.g., the flux application area 130, the heating area 140, and/or the selective soldering area 150. The holder 170 may form the primary attachment between the conveyor 120 and the workpiece whereby the workpiece is indirectly conveyed by the conveyor 120 via the holder 170. Alternatively, the holder 170 may supplement the attachment between the conveyor 120 and the workpiece while preventing relative movement between the workpiece and the conveyor 120.

By preventing relative movement (i.e., slippage) between the workpiece and the conveyor 120 using the holder 170, the controller 110 may continuously monitor the position of the workpiece as the workpiece is conveyed by the conveyor 120 through the selective soldering machine 100. In embodiments, the controller 110 may associate a detected position of the workpiece relative to the conveyor 120 with tracked positional data of the conveyor 120 as the conveyor 120 moves the workpiece along the machine direction. The controller 110 may indirectly and continuously monitor a position of the workpiece as the workpiece is moved by the conveyor 120 along the machine direction based upon the tracked positional data of the conveyor 120 associated with the detected position of the workpiece.

For example, a sensor 135 of the flux application area 130 (described further below) and/or a sensor 155 of the selective soldering area 150 (described further below) may detect the position of workpiece relative to the conveyor 120. In embodiments in which the conveyor 120 includes a chain or a belt, the sensor (e.g., the sensor 135 and/or the sensor 155) may detect the position of the workpiece on/at the chain or belt, which does not change because the holder 170 prevents relative movement between the workpiece and the conveyor 120. The controller 110 may associate the detected position of the workpiece relative to the conveyor 120 with positional data of the conveyor 120 as the conveyor 120 moves the workpiece along the machine direction. For example, encoders (not shown) provided on the motor 160 may communicate to the controller 110 positional data of the chain/belt as the conveyor 120 moves the workpiece along the machine direction. The encoders may continuously provide positional data of the conveyor 120 to the controller 110 as the conveyor 120 conveys the workpiece through the selective soldering machine 100. Because the detected position of the workpiece relative to the conveyor 120 may be associated with the positional data of the moving conveyor 120, the controller 110 may indirectly and continuously monitor the position of the workpiece conveyed through the selective soldering machine 100 by tracking the positional data of the moving conveyor 120. The controller 110 may accurately control of the flux application area 130, the heating area 140, and/or the selective soldering area 150 by utilizing the continuously monitored position of the workpiece (i.e., as the workpiece is conveyed by the conveyor 120).

The flux application area 130 may apply flux to, e.g., the bottom of the one or more workpieces. The flux application area 130 may include a flux carriage 131 in fluid communication with a fluxing nozzle 132. Though the selective soldering machine 100 is disclosed as including one flux carriage and one fluxing nozzle, the present disclosure is not limited to this configuration and may include any number of flux carriages, nozzles, etc. The fluxing nozzle 132 may be a spray fluxer, a drop jet fluxer, and/or an atomizing fluxer, and may also be configured to clean components of the workpieces before the workpieces are soldered. For example, any impurities, such as the forming of oxide layers on the substrate, can affect the soldering process which may then lead to poor quality solder joints.

The fluxing nozzle 132 may move, e.g., via movement of the flux carriage 131, along the machine direction, along the direction orthogonal to the machine direction, and/or along the Z direction while the workpiece is moving along the machine direction on the conveyor 120. The flux application area 130 further includes the sensor 135 that may sense movement of, e.g., a leading edge of the workpiece and may transmit information associated with the sensed movement via a wired and/or wireless connection to the controller 110. The controller 110 may selectively control movement of the fluxing nozzle 132, e.g., via movement of the flux carriage 131, to predetermined positions of the workpiece and along the machine direction based upon the information associated with the movement of the workpiece sensed by the sensor 135. Based upon the transmitted information associated with the movement sensed by the sensor 135, the controller 110 may synchronize movement of the fluxing nozzle 132, e.g., via movement of the flux carriage 131, with the movement of the workpiece along the machine direction before the fluxing nozzle 132 applies flux to the workpiece.

The heating area 140 may to heat the workpiece. For example, the heating area 140 may be configured to heat the bottoms of the one or more workpieces. The heating area 140 may include one or more heaters 141, which may be non-contact (e.g., infrared, convection, etc.) heaters. The heating area 140 may be provided with a bottom heater disposed between the flux application area 130 and the selective soldering area 150 that is configured to elevate the temperature of the workpiece as the workpiece is conveyed through the heating area 140. The selective soldering machine 100 may be provided with a top heater that extends along the machine direction and above each of the flux application area 130, the heating area 140, and the selective soldering area 150 (e.g., along the entirety of the machine direction of the selective soldering machine 100) to assist the bottom heater in elevating the temperature of the workpiece and to maintain the elevated temperature of the workpiece during the soldering process. The one or more heaters 141 may heat the workpiece (e.g., a first workpiece) while the workpiece moves along the machine direction, while a selective soldering nozzle 152 (e.g., a first selective soldering nozzle) applies solder to the workpiece, and/or while the fluxing nozzle 132 applies flux to the workpiece.

The selective soldering area 150 may include a selective soldering nozzle 152 (e.g., a first selective soldering nozzle). The selective soldering area 150 may further include a solder carriage 151 having a solder pot 153 with a pump 154 disposed therein and the selective soldering nozzle 152 attached thereto. Though the selective soldering machine 100 is disclosed as including one solder carriage, one solder pot, and one solder nozzle, the present disclosure is not limited to this configuration and may include any number of solder carriages, pots, nozzles, etc. The pump 154 may pump molten solder (e.g., tin alloy solder) from the solder pot 153 to the selective soldering nozzle 152, which is in fluid communication with the solder pot 153. The selective soldering area 150 may further include the sensor 155. The selective soldering area 150 may selectively solder the bottoms of the one or more workpieces. By utilizing selective soldering, as opposed to wave soldering, molten solder may be applied to individual pins of a component on a substrate, or groups of pins, without disturbing other components that need not be soldered or cannot withstand, for example, the heat producing effects of wave soldering machines. Selective soldering may, for example, include forming a small fountain (e.g., column) of solder using a nozzle (e.g., the selective soldering nozzle 152) that is oriented vertically, and the nozzle and the fountain of solder are selectively raised to engage the workpiece.

The selective soldering nozzle 152 may move along the machine direction, a direction orthogonal to the machine direction (e.g., along a vertical Y axis as depicted in FIG. 1) and/or along an up-down "Z direction" (not shown) that is orthogonal to both the machine direction and the direction orthogonal to the machine direction to selectively apply solder to the workpiece (e.g., at bottoms thereof) while the workpiece is moving along the machine direction on the conveyor 120. For example, the selective soldering nozzle 152 may apply solder to a subset of a plurality of exposed component pins on the workpiece. The sensor 155 may sense movement of, e.g., a leading edge of the workpiece and may transmit information associated with the sensed movement via a wired and/or wireless connection to the controller 110, which is configured to control operation of the selective soldering nozzle 152. For example, the controller 110 may selectively control movement of the selective soldering nozzle 152, e.g., via movement of the solder carriage 151 which includes movement of the solder pot 153 (and/or of a second solder pot not shown), to predetermined positions of the workpiece and to control movement along the machine direction based upon the information associated with the movement of the workpiece as sensed by the sensor 155. In embodiments, based upon the transmitted information associated with the movement sensed by the sensor 155 the controller 110 may synchronize movement of the selective soldering nozzle 152, e.g., via movement of the solder carriage 151 which includes movement of the solder pot 153, with the movement of the workpiece along the machine direction before the selective soldering nozzle 152 applies solder to the workpiece.

Based upon the above aspects of the present disclosure, the selective soldering machine 100 is configured to move workpieces through the machine in a shorter time period than traditional multiple station selective soldering machines that require a stoppage of the conveyance of the workpieces to perform required work thereon. That is, the throughput capacity of the selective soldering machine 100 is increased relative to traditional selective soldering machines, since the flux application area 130, the heating area 140, and the selective soldering area 150 are configured to operate on the workpiece while the workpiece is moving along the machine direction on the conveyor 120, i.e., without stopping the workpiece. In addition, the complexity, cost, and overall footprint of the selective soldering machine 100 is reduced due to the elimination of components required for stopping the workpieces at each area. Further, due to the elimination of the components required for stopping the workpieces at each area, the flux application area 130 may directly abut against the heating area 140, and the heating area 140 may directly abut against the selective soldering area 150 to thereby further reduce the footprint of the selective soldering machine 100. In addition, the length of the workpiece is not limited by the size of the selective soldering machine 100, since the flux application area 130, the heating area 140, and the selective soldering area 150 are configured to operate on the workpiece while the workpiece is moving along the machine direction on the conveyor 120, i.e., without stopping the workpiece.

Figure 2:
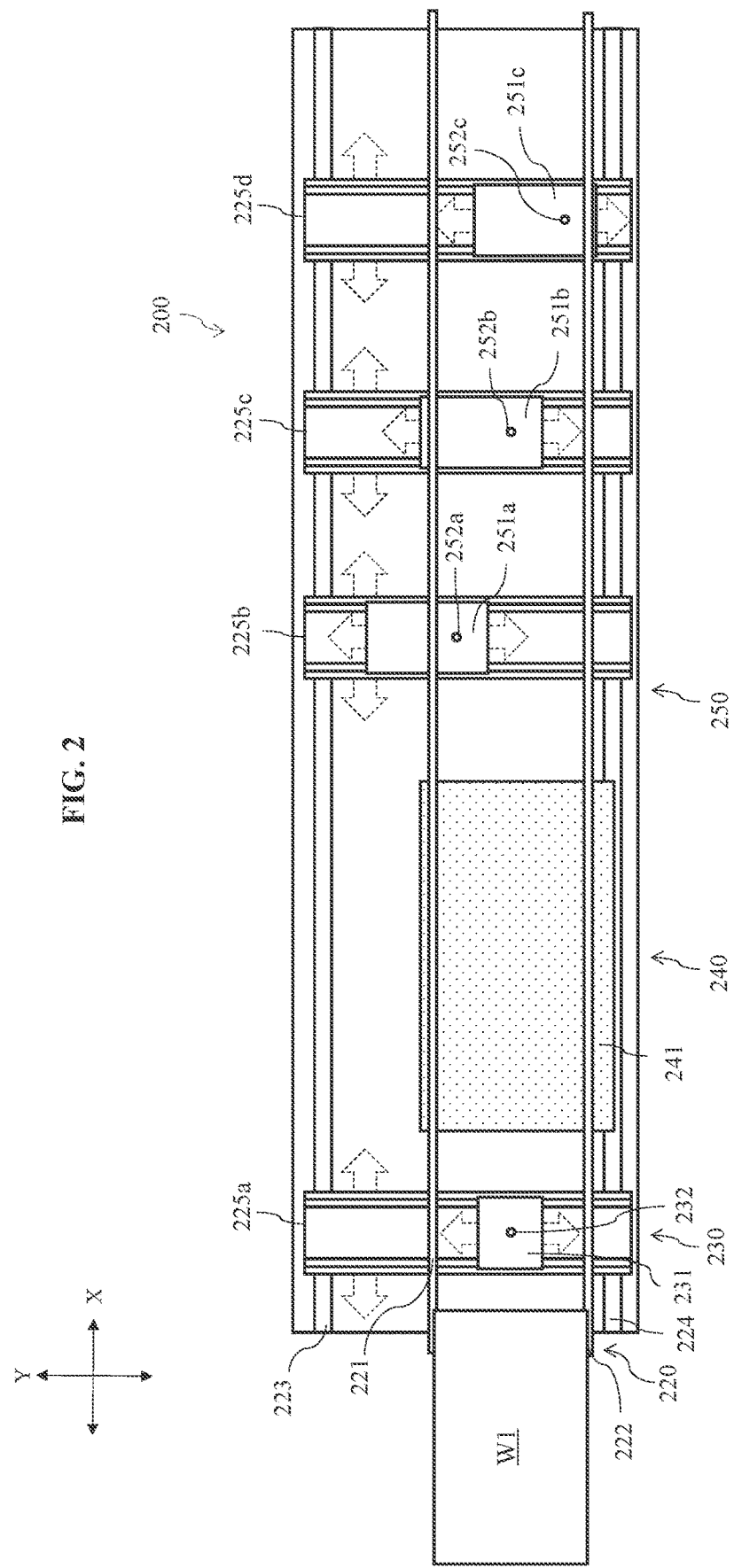
FIG. 2 illustrates a top schematic view of another exemplary soldering machine in accordance with aspects of the present disclosure.

With reference to FIGS. 2-5 generally, and more particularly with reference to FIG. 2, another selective soldering machine 200 in accordance with aspects of the present disclosure is illustrated. Unless specifically stated to the contrary, the above described features of the selective soldering machine 100 may be used separately and/or in various combinations with the below described features of the selective soldering machine 200, and vice versa. In addition, the selective soldering machine 200 may exhibit the same or similar advantages over the state of the art, as described above with respect to the soldering machine 100.

As depicted in FIG. 2, a first workpiece W1 may enter the queue on a conveyor 220. The conveyor 220 may include a first conveyor rail 221 and a second conveyor rail 222 that are arranged in parallel and that may extend along the machine direction (e.g., along the X-axis depicted in FIG. 2) across the entirety of the selective soldering machine 200 to convey the first workpiece W1 through each of a flux application area 230, a heating area 240 having a heater 241, and a selective soldering area 250.

The selective soldering machine 200 may further include a first support rail 223 and a second support rail 224 that are also arranged in parallel and that may extend along the machine direction across the entirety of the selective soldering machine 200. The first support rail 223 and the second support rail 224 may support a series of beams, e.g., a first beam 225a, a second beam 225b, a third beam 225c, and fourth beam 225d. The series of beams are each controlled by a controller (not shown), e.g., a computer, and are driven by actuators (not shown), e.g., motors, that permit free movement of the respective rails along the machine direction, as depicted in FIG. 2.

In particular, the first beam 225a of the selective soldering machine 200 is associated with the flux application area 230 and includes a flux carriage 231 provided thereon. The flux carriage 231 is controlled by the controller and driven by an actuator (not shown), e.g. at motor, that permits free movement in the direction orthogonal to the machine direction (e.g., the Y axis depicted in FIG. 2) and in the Z direction (i.e., an up-down direction orthogonal to the X and the Y axis depicted in FIG. 2). The controller may selectively position a fluxing nozzle 232 of the flux carriage 231 at predetermined positions of the first workpiece W1 and may direct the fluxing nozzle 232, e.g., via movement of the flux carriage 231, to apply flux to the predetermined positions. Though the selective soldering machine 200 includes one flux carriage and one fluxing nozzle, the present disclosure is not limited to this configuration and may further include a plurality of flux carriages and fluxing nozzles. Accordingly, the flux application area 230 may include, for example, the first beam 225a, the flux carriage 231, and the fluxing nozzle 232. The fluxing area 230 may abut against the heating area 240. Though the selective soldering machine 200 is disclosed as including one flux carriage, one fluxing nozzle, etc., the present disclosure is not limited to this configuration and may include any number of flux carriages, nozzles, etc.

The second beam 225b, the third beam 225c, and the fourth beam 225d are each respectively associated with a first solder carriage 251a, a second solder carriage 251b, and a third solder carriage 251c of the selective soldering area 250 and are each similarly controlled by the controller and driven by respective actuators (not shown), e.g., motors, that permit free movement in the direction orthogonal to the machine direction and in the Z direction (i.e., an up-down direction). The first solder carriage 251a, the second solder carriage 251b, and the third solder carriage 251c respectively include a first selective soldering nozzle 252a, a second selective soldering nozzle 252b, and a third selective soldering nozzle 252c. Each of the first selective soldering nozzle 252a, the second selective soldering nozzle 252b, and the third selective soldering nozzle 252c are in fluid communication with respective solder pots (not shown). Though the selective soldering machine 200 is disclosed as including three solder carriages, three selective soldering nozzles, etc., the present disclosure is not limited to this configuration and may include any number of solder carriages and nozzles including only one of each.

The controller may selectively position the first selective soldering nozzle 252a, the second selective soldering nozzle 252b, and the third selective soldering nozzle 252c at predetermined positions of the first workpiece W1 (e.g., via movement of the respective first, second, and third solder carriages 251a, 251b, 251c including movement of respective first, second, and third solder pots (not shown)) and may direct the respective selective soldering nozzles to apply solder to the predetermined positions. By utilizing selective soldering, as opposed to wave soldering, molten solder may be applied to individual pins of a component on a substrate, or groups of pins, without disturbing other components that need not be soldered or cannot withstand, for example, the heat producing effects of wave soldering machines.

For example, the first selective soldering nozzle 252a, the second selective soldering nozzle 252b, and the third selective soldering nozzle 252c may each be configured to move along the machine direction, a direction orthogonal to the machine direction and along an up-down "Z direction" that is orthogonal to both the machine direction and the direction orthogonal to the machine direction to selectively apply solder to the workpiece (e.g., at bottoms thereof) while the workpiece is moving along the machine direction on the conveyor 220. The first selective soldering nozzle 252a, the second selective soldering nozzle 252b, and the third selective soldering nozzle 252c may apply solder to the same workpiece simultaneously while the workpiece is constantly conveyed along the machine direction. For example, the first selective soldering nozzle 252a may move along the machine direction and/or the direction orthogonal to the machine direction and may apply solder to the first workpiece W1 while the first workpiece W1 moves along the machine direction on the conveyor 220. The second selective soldering nozzle 252b may move along the machine direction and/or the direction orthogonal to the machine direction and may apply solder to the first workpiece W1 while the first workpiece W1 moves along the machine direction and while the first selective soldering nozzle 252a applies solder to the first workpiece W1.

Accordingly, the selective soldering area 250 may include, for example, the second beam 225b, the third beam 225c, the fourth beam 225d, the first solder carriage 251a, the second solder carriage 251b, the third solder carriage 251c, the first selective soldering nozzle 252a, the second selective soldering nozzle 252b, and/or the third selective soldering nozzle 252c.

Figure 3:
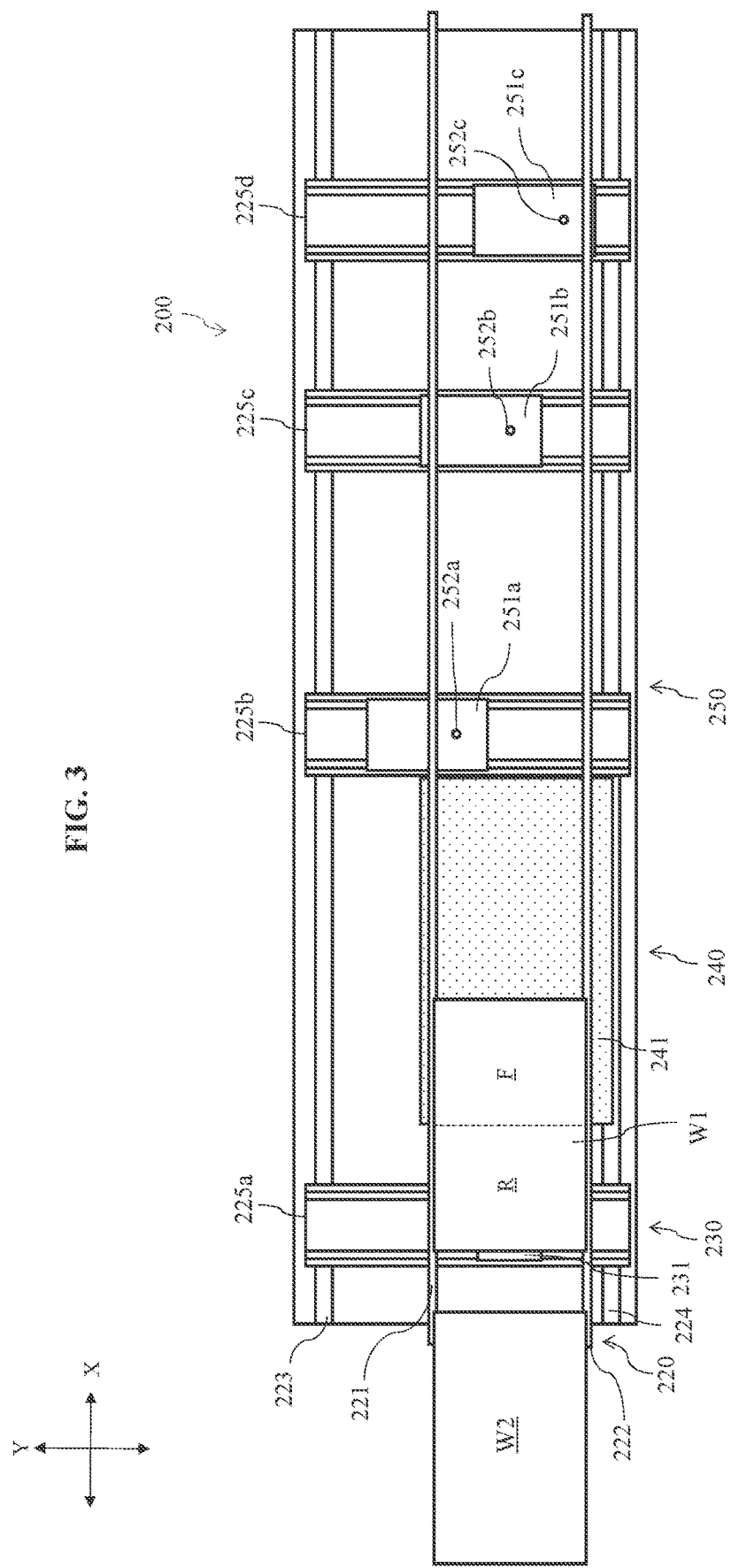
FIG. 3 illustrates a top schematic view of the exemplary soldering machine of FIG. 2 while the machine operates on a first workpiece and with a second workpiece in the queue.

Referring to FIG. 3, the selective soldering machine 200 is depicted while the machine operates on a first workpiece W1 and with a second workpiece W2 in the queue. A sensor (not shown) associated with the fluxing nozzle 232 may be configured to sense movement of a leading edge of the first workpiece W1 and the controller may be configured to synchronize the movement of the fluxing nozzle 232, e.g., via movement of the flux carriage 231, with the movement of the first workpiece W1 based upon transmitted information associated with the sensed movement of the leading edge of the first workpiece W1. The fluxing nozzle 232 may move along the machine direction and the direction orthogonal to the machine direction and the fluxing nozzle 232 may apply flux to the first workpiece W1 while the first workpiece W1 moves along the machine direction on the conveyor 220. The controller may further be configured to selectively control movement of the fluxing nozzle 232, e.g., via movement of the flux carriage 231, to predetermined positions of the first workpiece W1 and to direct the fluxing nozzle 232 to apply flux to the predetermined positions while the first workpiece W1 moves along the machine direction on the conveyor 220. For example, the sensor associated with the fluxing nozzle 232 may sense movement of the first workpiece W1 and the controller may selectively control movement of the fluxing nozzle 232 to predetermined positions of the first workpiece W1 to control movement of the fluxing nozzle 232 along the machine direction based upon the movement of the first workpiece W1 sensed by the sensor. The heater 241 of the heating area 240 may be configured to heat a front end F of the first workpiece W1 while the first workpiece W1 moves along the machine direction and while the fluxing nozzle 232 applies flux to a rear end R of the first workpiece W1.

Figure 4:
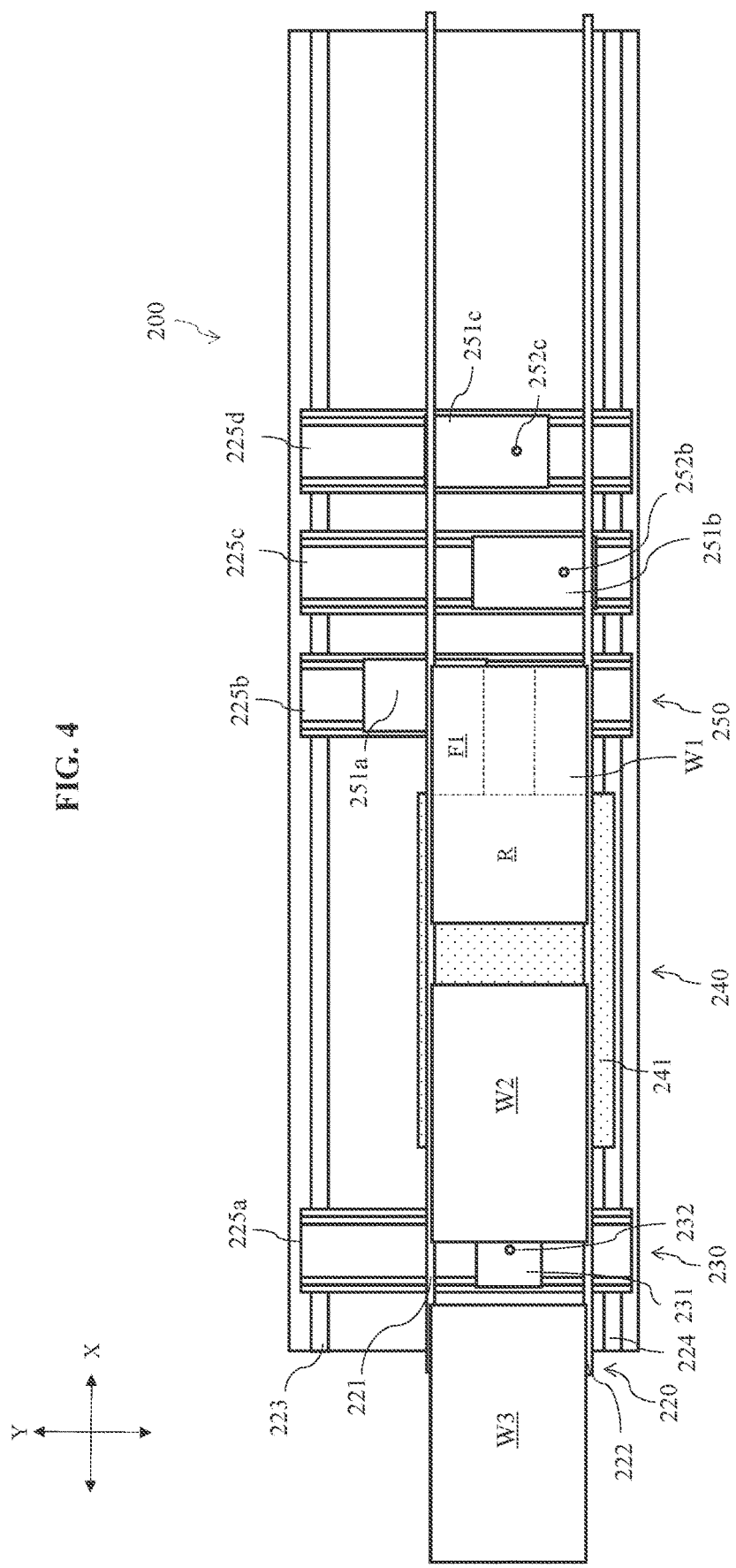
FIG. 4 illustrates a top schematic view of the exemplary soldering machine of FIGS. 2 and 3 while the machine operates on the first and second workpieces and with a third workpiece in the queue.

Referring to FIG. 4, the selective soldering machine 200 is depicted while the machine operates on the first and second workpieces W1, W2 and with a third workpiece W3 in the queue. The selective soldering machine 200 includes a plurality of sensors (not shown) that are each associated with one of the first selective soldering nozzle 252a, the second selective soldering nozzle 252b, and the third selective soldering nozzle 252c and each may be configured to sense movement of, e.g., a leading edge of the first workpiece W1. The controller may be configured to selectively control and/or synchronize the movement of the respective first, second, and third soldering nozzles 252a, 252b, 252c, e.g., via movement of the respective first, second, and third solder carriages 251a, 251b, 251c including movement of the respective first, second, and third solder pots, with the movement of the first workpiece W1 based upon the transmitted information associated with the sensed movement of the leading edge of the first workpiece W1. The controller may further be configured to selectively control movement of the respective first, second, and third soldering nozzles 252a, 252b, 252c, e.g., via movement of the respective first, second, and third solder carriages 251a, 251b, 251c including movement of the respective first, second, and third solder pots, to predetermined positions of the first workpiece W1 and to direct the respective soldering nozzles to selectively apply solder to the predetermined positions while the first workpiece W1 moves along the machine direction on the conveyor 220. The heater 241 of the heating area 240 is configured to heat the rear end R of the first workpiece W1 while the first workpiece W1 moves along the machine direction and while the first selective soldering nozzle 252a applies solder to a first front portion F1 of the first workpiece W1. Further, while the heating area 240 and the selective soldering area 250 operate on the first workpiece W1, the flux application area 230 and the heating area 240 may simultaneously operate on the second workpiece W2 and a third workpiece W3 may enter the queue.

Figure 5:
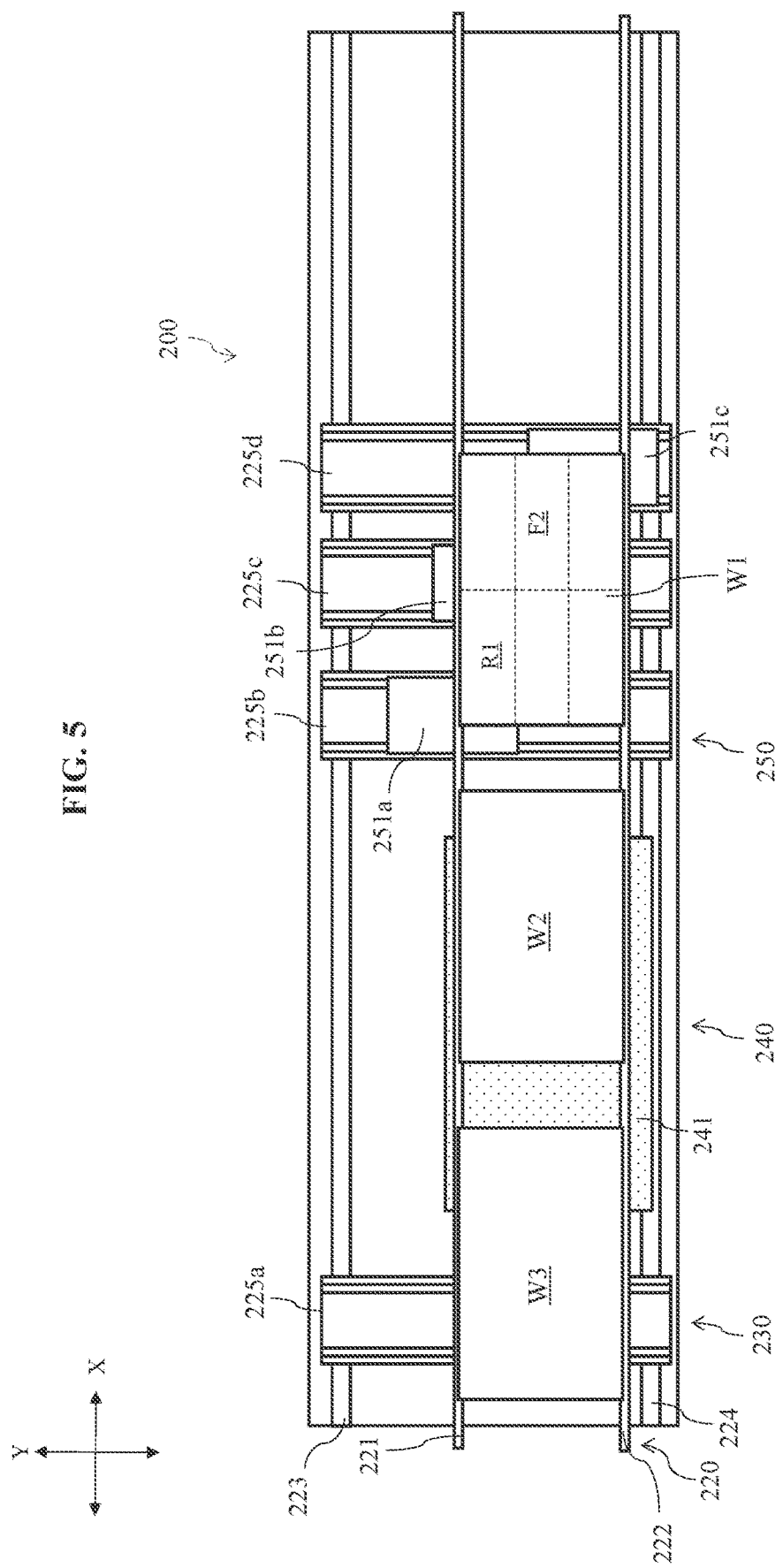
FIG. 5 illustrates a top schematic view of the exemplary soldering machine of FIGS. 2-4 while the machine operates on the first, second, and third workpieces.

Referring to FIG. 5, the selective soldering machine 200 is depicted while the machine operates simultaneously on the first, second, and third workpieces W1, W2, W3. The second selective soldering nozzle 252b (second solder pot) may be arranged staggered from the first selective soldering nozzle 252a (and first solder pot) and may selectively solder a second front portion F2 of the first workpiece W1 while the first workpiece W1 moves continuously along the machine direction and while the first selective soldering nozzle 252a selectively solders a first rear portion R1 of the first workpiece W1. In a similar manner, the first selective soldering nozzle 252a, the second selective soldering nozzle 252b, and the third selective soldering nozzle 252c may simultaneously selectively solder portions of the first workpiece W1 while the first workpiece W1 is continuously conveyed along the conveyor 220. A workpiece (not shown) of a sufficient length may simultaneously be operated upon by each component of the flux application area 230, the heating area 240, and the selective soldering area 250 while the workpiece is continuously conveyed through the machine.

The conveyor 220 may move the second workpiece W2 in the machine direction subsequent to reception of the first workpiece W1. The first selective soldering nozzle 252a may apply solder to the second workpiece W2 while the second workpiece W2 moves along the machine direction and while the second selective soldering nozzle 252b applies solder to the first workpiece W1.

Figure 6:
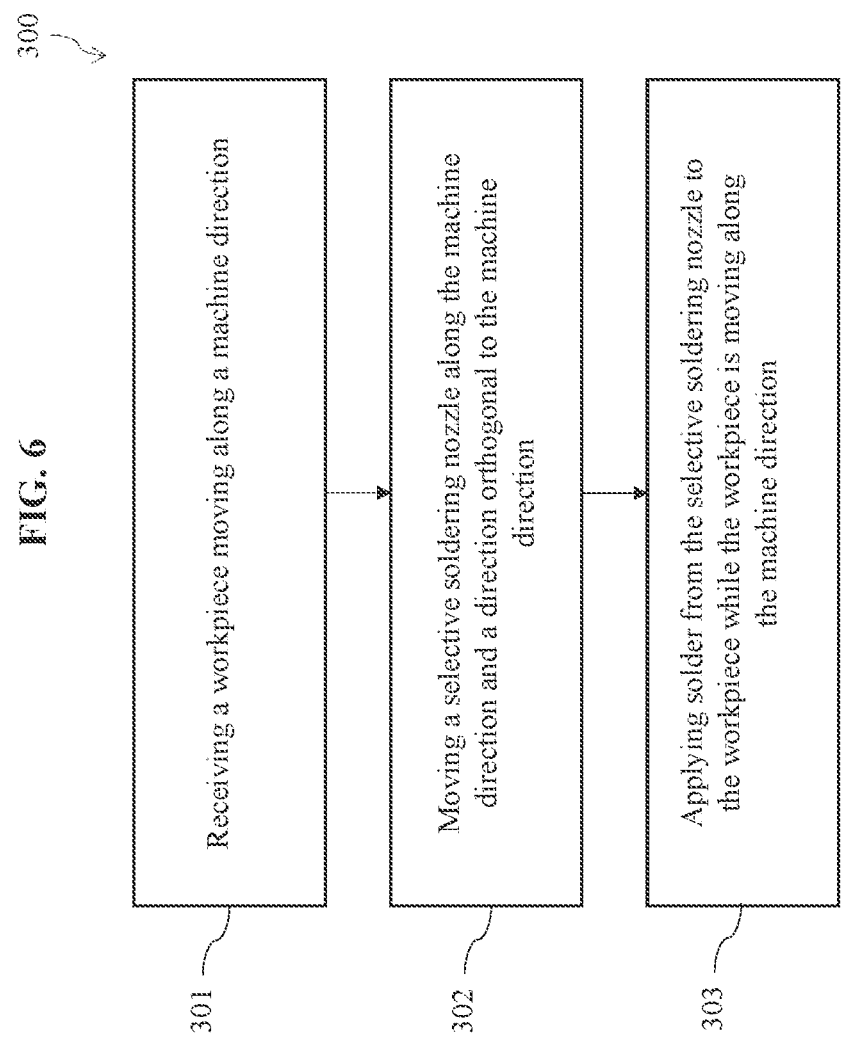
FIG. 6 illustrates an exemplary process for applying solder to a workpiece in accordance with aspects of the present disclosure.

Referring to FIG. 6, a process 300 is depicted for applying solder to a workpiece in accordance with aspects of the present disclosure. At step 301, a selective soldering machine (e.g., the selective soldering machine 100, the selective soldering machine 200, etc.) may receive a workpiece (e.g., a first workpiece) moving along a machine direction. Receiving the first workpiece moving along the machine direction may include moving the first workpiece along the machine direction using a conveyor. The process 300 may further include receiving a second workpiece moving along the machine direction subsequent to reception of the first workpiece.

The process 300 may also include preventing relative movement (i.e., slippage) between the workpiece and the conveyor using the holder. The process 300 may also include continuously monitoring the position of the workpiece as the workpiece is conveyed by the conveyor through the selective soldering machine. For example, the process 300 may include associating a detected position of the workpiece relative to the conveyor 120 with tracked positional data of the conveyor as the conveyor moves the workpiece along the machine direction. The process 300 may include indirectly and continuously monitoring a position of the workpiece as the workpiece is moved by the conveyor along the machine direction based upon the tracked positional data of the conveyor associated with the detected position of the workpiece. The process 300 may include controlling the selective soldering machine (e.g., the flux application area, the heating area, and/or the selective soldering area), in accordance with any of the aspects of the processes 300 and 400 described below, based upon the indirect and continuously monitored position of the workpiece.

The process 300 may include the selective soldering machine moving one or more fluxing nozzle along the machine direction and the direction orthogonal to the machine direction and applying flux from the fluxing nozzle to the workpiece (e.g., the first workpiece) while the workpiece is continuously moving along the machine direction. The moving of the fluxing nozzle along the machine direction may track the moving of the first workpiece along the machine direction. The process 300 may further include a sensor of the selective soldering machine sensing the movement of a leading edge of the workpiece and moving any associated fluxing nozzle along the machine direction such that the selective soldering nozzle tracks the sensed movement of the workpiece along the machine direction. For example, the process 300 may include sensing a movement of a leading edge of the first workpiece, moving the fluxing nozzle along the machine direction so as to track the moving of the first workpiece along the machine direction based upon the sensed movement of the leading edge of the first workpiece, and applying the flux while the fluxing nozzle tracks the movement of the first workpiece along the machine direction. The process 300 may include the selective soldering machine synchronizing the movement of any associated fluxing nozzle with the movement of the workpiece prior to the applying of the flux from the associated selective fluxing nozzle and basing the synchronizing upon the sensed movement of the leading edge of the workpiece. For example, the process 300 may include synchronizing the movement of the fluxing nozzle with the movement of the first workpiece, prior to the applying of the flux from the fluxing nozzle, based upon the sensed movement of the leading edge of the first workpiece.

The process 300 may include the selective soldering machine heating the workpiece (e.g., the first workpiece) while the workpiece is moving along the machine direction. The process 300 may include the selective soldering machine heating the workpiece while any associated fluxing nozzles are applying flux to the workpiece and/or while any associated selective soldering nozzles are applying solder to the workpiece. For example, the process 300 may include heating the first workpiece while the first workpiece is moving along the machine direction and while the first selective soldering nozzle is applying solder to the first workpiece. The process 300 may include heating the first workpiece while the first workpiece is moving along the machine direction and while the fluxing nozzle is applying flux to the first workpiece.

At step 302, the selective soldering machine may move a first selective soldering nozzle, e.g., including movement of a first solder pot, along the machine direction and along a direction orthogonal to the machine direction. The moving of the first selective soldering nozzle along the machine direction may track the moving of the workpiece along the machine direction. The process 300 may further include the selective soldering machine moving, e.g., second, third, or more selective soldering nozzles, e.g., including movement of respective second, third, or more solder pots, along the machine direction and along the direction orthogonal to the machine direction. The process 300 may further include the selective soldering machine sensing the movement of, e.g., a leading edge of the workpiece and moving any associated selective soldering nozzle and solder pot along the machine direction such that the selective soldering nozzle and solder pot tracks the sensed movement of the workpiece along the machine direction. The moving of the first selective soldering nozzle along the machine direction may track the moving of the workpiece along the machine direction based upon the sensed movement of the leading edge of the workpiece.

For example, the moving of the first selective soldering nozzle along the machine direction may track the moving of the first workpiece along the machine direction. The process may include sensing movement of a leading edge of the first workpiece. Moving the first selective soldering nozzle along the machine direction may track the moving of the first workpiece along the machine direction based upon the sensed movement of the leading edge of the first workpiece. The process 300 may include moving a second selective soldering nozzle along the machine direction and the direction orthogonal to the machine direction. The process 300 my include moving a third selective soldering nozzle along the machine direction and the direction orthogonal to the machine direction.

At step 303, the process 300 may include the selective soldering machine applying solder from the first selective soldering nozzle to the workpiece while the workpiece is moving along the machine direction. The process 300 may include the selective soldering machine applying solder from a plurality of selective soldering nozzles (e.g., the second and third selective soldering nozzles) while moving the workpiece along the machine direction and may further include applying solder from an associated selective soldering nozzle while one or more selective soldering nozzles are applying solder to the same workpiece. The process 300 may include the selective soldering machine applying solder while any associated selective soldering nozzle and solder pot tracks the movement of the workpiece along the machine direction. The process 300 may include the selective soldering machine synchronizing the movement of any associated selective soldering nozzle and solder pot with the movement of the workpiece prior to the applying of the solder from the associated selective soldering nozzle and basing the synchronizing upon the sensed movement of the leading edge of the workpiece.

For example, applying of the solder may occur while the first selective soldering nozzle tracks the movement of the first workpiece along the machine direction. The process 300 may include synchronizing the movement of the first selective soldering nozzle with the movement of the first workpiece, prior to the applying of the solder from the first selective soldering nozzle, based upon the sensed movement of the leading edge of the first workpiece. The process 300 may include applying solder from the second selective soldering nozzle to the first workpiece while the first workpiece is moving along the machine direction and while the first selective soldering nozzle is applying solder to the first workpiece. The process 300 may include applying solder from the third selective soldering nozzle to the first workpiece while first workpiece is moving along the machine direction and while the first and second selective soldering nozzles are applying solder to the first workpiece. Moving the first, second and third selective soldering nozzles along the machine direction may track the moving of the first workpiece along the machine direction. The process 300 may include sensing a movement of a leading edge of the first workpiece where the moving of the first, second, and third selective soldering nozzles along the machine direction may track the moving of the first workpiece along the machine direction based upon the sensed movement of the leading edge of the first workpiece and applying the solder occurs while the respective first, second, and third selective soldering nozzles track the movement of the first workpiece along the machine direction. The process 300 may include synchronizing the movement of the first, second, and third selective soldering nozzles with the movement of the first workpiece, prior to the applying of the solder from the respective first, second, and third selective soldering nozzles, based upon the sensed movement of the leading edge of the first workpiece. The process 300 may include applying solder from the first selective soldering nozzle to the second workpiece while the second workpiece is moving along the machine direction, and while the second selective soldering nozzle is applying solder to the first workpiece.

Figure 7:
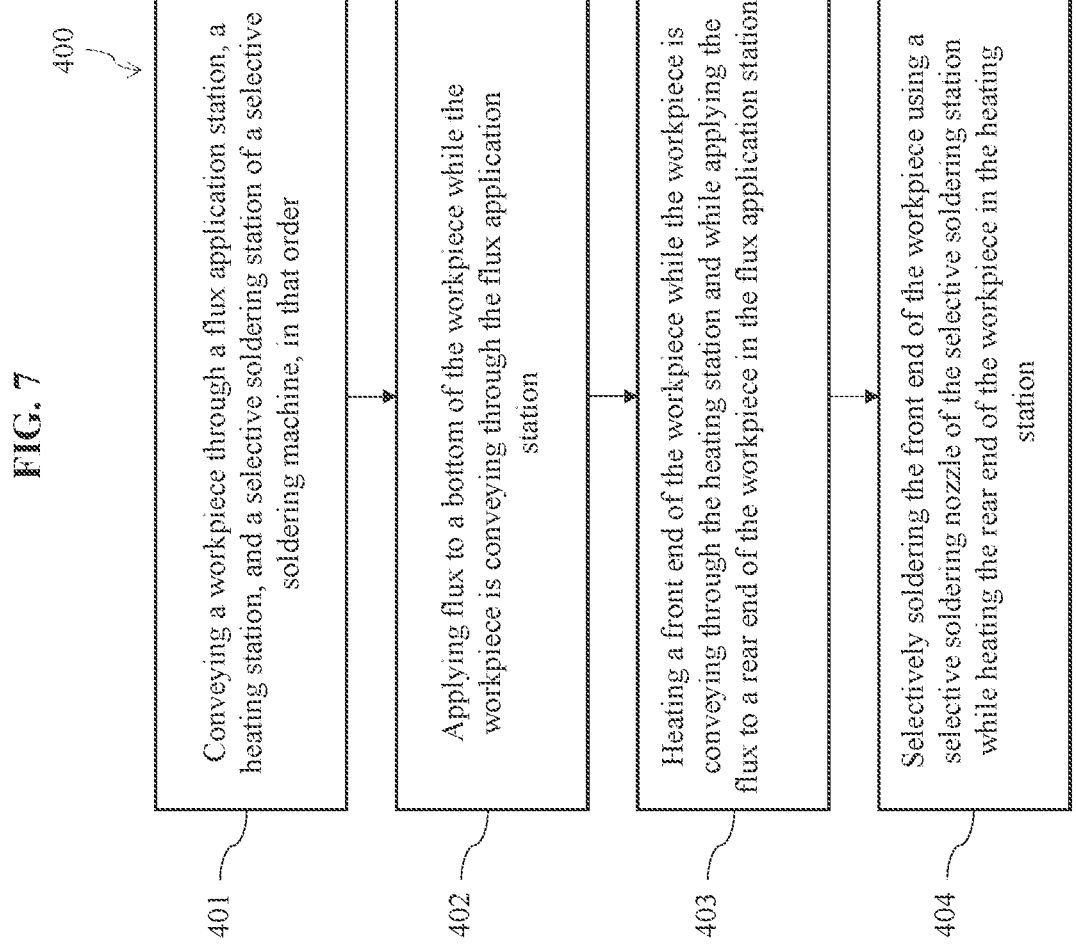
FIG. 7 illustrates another exemplary process for applying solder to a workpiece in accordance with aspects of the present disclosure.

Referring to FIG. 7, another process 400 is depicted for applying solder to a workpiece in accordance with aspects of the present disclosure. At step 401, a selective soldering machine (e.g., the selective soldering machine 100, the selective soldering machine 200, etc.) conveys a workpiece (e.g., a first workpiece) through a flux application area, a heating area, and a selective soldering area, in that order. Conveying the first workpiece may include moving the first workpiece along a machine direction using a conveyor. The process 400 may include constantly moving the workpiece through the flux application area, the heating area, and the selective soldering area.

At step 402, the selective soldering machine applies flux to the workpiece (e.g., at a bottom thereof) while conveying the workpiece through the flux application area. For example, the process 400 may include moving a fluxing nozzle of the flux application area that applies the flux, along a machine direction whereby the first workpiece is conveyed and a direction orthogonal to the machine direction while applying the flux and while the first workpiece is conveying through the flux application area. At step 403, the selective soldering machine heats the workpiece (e.g., at a front end thereof) while conveying the workpiece through the heating area and while applying flux to the workpiece (e.g., at a rear end thereof) in the flux application area.

At step 404, the selective soldering machine solders the workpiece (e.g., at the front end thereof) using a selective soldering nozzle of the selective soldering area while heating the workpiece (e.g., at the rear end thereof) in the heating area. The process 400 may include the selective soldering machine selectively soldering a first portion of the front end of the workpiece using a first selective soldering nozzle of the selective soldering area while heating the rear end of the workpiece in the heating area. The process 400 may include the selective soldering machine selectively soldering a second portion of the front end of the workpiece using a second selective soldering nozzle that is staggered from the first selective soldering nozzle while selectively soldering a first portion of the rear end of the workpiece using the first selective soldering nozzle. The process 400 may include moving the selective soldering nozzle of the selective soldering area along the machine direction and the direction orthogonal to the machine direction while the first workpiece is conveying through the selective soldering area. Based upon aspects of the present disclosure, larger workpieces (i.e., workpieces having longer lengths in the conveyance direction of the machine) can be accommodated in the selective soldering machine since the process 400 includes the capacity for simultaneous operation of the flux application area, the heating area, and the selective soldering area on the same workpiece.

It will be appreciated that the foregoing description provides examples of the disclosed machine. However, it is contemplated that other implementations of the invention may differ in detail from the foregoing examples. All references to the invention or examples thereof are intended to reference the particular example being discussed at that point and are not intended to imply any limitation as to the scope of the invention more generally. All language of distinction and disparagement with respect to certain features is intended to indicate a lack of preference for those features, but not to exclude such from the scope of the invention entirely unless otherwise indicated. All methods described herein can be performed in any suitable order unless otherwise indicated herein or otherwise clearly contradicted by context.

What is claimed is:

1. A method for applying solder to a workpiece, the method comprising:
   receiving a first workpiece moving along a machine direction;
   moving a first selective soldering nozzle along the machine direction and a direction orthogonal to the machine direction; and
   applying solder from the first selective soldering nozzle to the first workpiece while the first workpiece and the first selective soldering nozzle are moving along the machine direction, whereby the first workpiece moves along the machine direction, without stopping, while the first selective soldering nozzle applies the solder to a first predetermined position on the first workpiece.

2. The method of claim 1, wherein:
   the receiving step comprises moving the first workpiece along a conveyor; and
   the method further comprises:
      preventing relative movement between the first workpiece and the conveyor;
      associating a detected position of the first workpiece relative to the conveyor with tracked positional data of the conveyor as the conveyor moves the first workpiece along the machine direction; and
      monitoring, indirectly and continuously, a position of the first workpiece as the conveyor moves the first workpiece along the machine direction based upon the tracked positional data of the conveyor associated with the detected position of the first workpiece.

3. The method of claim 1, further comprising sensing, with a sensor, movement of a leading edge of the first workpiece, wherein
   the moving of the first selective soldering nozzle along the machine direction tracks the moving of the first workpiece along the machine direction based upon the sensed movement of the leading edge of the first workpiece, and
   the applying of the solder occurs while the first selective soldering nozzle tracks the movement of the first workpiece along the machine direction.

4. The method of claim 3, further comprising synchronizing the movement of the first selective soldering nozzle with the movement of the first workpiece, prior to the applying of the solder from the first selective soldering nozzle, based upon the sensed movement of the leading edge of the first workpiece.

5. The method of claim 1, further comprising:
   moving a second selective soldering nozzle along the machine direction and the direction orthogonal to the machine direction; and
   applying solder from the second selective soldering nozzle to the first workpiece while the first workpiece is moving along the machine direction and while the first selective soldering nozzle is applying solder to the first workpiece.

6. The method of claim 5, further comprising:
   moving a third selective soldering nozzle along the machine direction and the direction orthogonal to the machine direction; and
   applying solder from the third selective soldering nozzle to the first workpiece while the first workpiece is moving along the machine direction and while the first and second selective soldering nozzles are applying solder to the first workpiece.

7. The method of claim 6, further comprising sensing, with a sensor, a movement of a leading edge of the first workpiece, wherein
   the moving of the first, second, and third selective soldering nozzles along the machine direction tracks the moving of the first workpiece along the machine direction based upon the sensed movement of the leading edge of the first workpiece, and
   the applying of the solder occurs while the respective first, second, and third selective soldering nozzles track the movement of the first workpiece along the machine direction.

8. The method of claim 7, further comprising synchronizing the movement of the first, second, and third selective soldering nozzles with the movement of the first workpiece, prior to the applying of the solder from the respective first, second, and third selective soldering nozzles, based upon the sensed movement of the leading edge of the first workpiece.

9. A system for applying solder to a workpiece, the system comprising:
a conveyor for moving a first workpiece along a machine direction; and
a first selective soldering nozzle configured to move along the machine direction and a direction orthogonal to the machine direction, and to apply solder to the first workpiece while the first workpiece and the first selective soldering nozzle are moving along the machine direction on the conveyor, whereby the conveyor is configured to move the first workpiece along the machine direction, without stopping, while the first selective soldering nozzle applies the solder to a first predetermined position on the first workpiece.

10. The system of claim 9, further comprising a second selective soldering nozzle configured to move along the machine direction and the direction orthogonal to the machine direction, and to apply solder to the first workpiece while the first workpiece is moving along the machine direction on the conveyor and while the first selective soldering nozzle applies solder to the first workpiece.

11. The system of claim 10, further comprising a third selective soldering nozzle configured to move along the machine direction and the direction orthogonal to the machine direction, and to apply solder to the first workpiece while the first workpiece is moving along the machine direction on the conveyor and while the first and second selective soldering nozzles apply solder to the first workpiece.

12. The system of claim 10, wherein
the conveyor moves a second workpiece in the machine direction subsequent to reception of the first workpiece, and
the first selective soldering nozzle is configured to apply solder to the second workpiece while the second workpiece moves along the machine direction and while the second selective soldering nozzle applies solder to the first workpiece.

13. The method of claim 1, wherein solder is applied to the first workpiece while the first workpiece is moving in a synchronized manner with the first selective soldering nozzle along the machine direction.

14. The method of claim 1, wherein:
the receiving step comprises moving the first workpiece along a conveyor of a selective soldering machine through each of a flux application area, a heating area, and a selective soldering area that includes the first selective soldering nozzle, wherein the conveyor comprises:
a first conveyor rail; and
a second conveyor rail, wherein the first conveyor rail and the second conveyor rail are arranged in parallel and extend along the machine direction across an entirety of the selective soldering machine to convey the first workpiece through each of the flux application area, the heating area, and the selective soldering area; and
wherein the selective soldering machine comprises:
a first support rail; and
a second support rail, wherein the first support rail and the second support rail are arranged in parallel and extend along the machine direction across the entirety of the selective soldering machine, and wherein the first support rail and the second support rail support a series of beams that include a first beam of the flux application area and a second beam of the selective soldering area, which are supported by the first support rail and the second support rail.

15. The method of claim 1, wherein the first workpiece moves along the machine direction, without stopping, while the first selective soldering nozzle applies the solder to the first predetermined position on the first workpiece and at least until the first selective soldering nozzle applies the solder to a second predetermined position on the first workpiece.

16. A selective soldering machine for selectively soldering workpieces, comprising:
a flux application area configured to apply flux to bottoms of the workpieces;
a heating area configured to heat the bottoms of the workpieces;
a selective soldering area configured to selectively solder the bottoms of the workpieces;
a conveyor configured to convey the workpieces, the conveyor extends through the flux application area, the heating area and the selective soldering area; and
a controller that is configured to control the conveyor to continuously convey the workpieces through the flux application area, the heating area, and the selective soldering area and to control application of flux, heat, and solder at each respective area without stopping the workpieces, wherein
the flux application area abuts against the heating area and the heating area abuts against the selective soldering area; and
wherein i) the flux application area comprises a fluxing nozzle that is configured to apply flux to a first workpiece of the workpieces while the fluxing nozzle and the first workpiece are moving in a machine direction, and ii) the selective soldering area comprises a first selective soldering nozzle that is configured to apply solder to the first workpiece while the first selective soldering nozzle and the first workpiece are moving in the machine direction, and
whereby the first workpiece moves along the machine direction, without stopping, while the first selective soldering nozzle applies the solder to a first predetermined position on the first workpiece.

17. The selective soldering machine of claim 16, wherein the first workpiece moves along the machine direction, without stopping, while the first selective soldering nozzle applies the solder to the first predetermined position on the first workpiece and at least until the first selective soldering nozzle applies the solder to a second predetermined position on the first workpiece.

18. The selective soldering machine of claim 16, wherein the first selective soldering nozzle is configured to apply solder to the first workpiece while the first workpiece is moving in a synchronized manner with the first selective soldering nozzle along the machine direction.

19. The selective soldering machine of claim 16, wherein the flux application area comprises the fluxing nozzle that is configured to apply flux to the first workpiece while the fluxing nozzle and the first workpiece are moving in the machine direction.

20. The selective soldering machine of claim 16, wherein the conveyor comprises:
a first conveyor rail; and
a second conveyor rail, wherein the first conveyor rail and the second conveyor rail are arranged in parallel and extend along the machine direction across an entirety of the selective soldering machine to convey the first workpiece through each of the flux application area, the heating area, and the selective soldering area that includes the first selective soldering nozzle.

21. The selective soldering machine of claim 20, wherein the selective soldering machine comprises:
   a first support rail; and
   a second support rail, wherein the first support rail and the second support rail are arranged in parallel and extend along the machine direction across the entirety of the selective soldering machine, and wherein the first support rail and the second support rail support a series of beams that include a first beam of the flux application area and a second beam of the selective soldering area, which are supported by the first support rail and the second support rail.

\* \* \* \* \*